(12) United States Patent
Yoshikawa et al.

(10) Patent No.: US 12,396,317 B2
(45) Date of Patent: Aug. 19, 2025

(54) LIGHT-EMITTING ELEMENT AND METHOD OF MANUFACTURING LIGHT-EMITTING ELEMENT

(71) Applicant: SHARP KABUSHIKI KAISHA, Sakai (JP)

(72) Inventors: Hirofumi Yoshikawa, Sakai (JP); Yoshihiro Ueta, Sakai (JP); Takahiro Doe, Sakai (JP); Masaki Yamamoto, Sakai (JP); Daisuke Toyoshima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 436 days.

(21) Appl. No.: 18/015,035

(22) PCT Filed: Jul. 22, 2020

(86) PCT No.: PCT/JP2020/028412
§ 371 (c)(1),
(2) Date: Jan. 6, 2023

(87) PCT Pub. No.: WO2022/018849
PCT Pub. Date: Jan. 27, 2022

(65) Prior Publication Data
US 2023/0276649 A1    Aug. 31, 2023

(51) Int. Cl.
*H10K 50/115* (2023.01)
*H10K 50/16* (2023.01)
*H10K 71/12* (2023.01)
*H10K 59/00* (2023.01)

(52) U.S. Cl.
CPC .......... *H10K 50/115* (2023.02); *H10K 50/16* (2023.02); *H10K 71/125* (2023.02); *H10K 59/00* (2023.02)

(58) Field of Classification Search
None
See application file for complete search history.

(56) References Cited

U.S. PATENT DOCUMENTS

2019/0067618 A1   2/2019   Xiao
2020/0321547 A1   10/2020  Wu

FOREIGN PATENT DOCUMENTS

CN    106531892 A    3/2017
CN    109994620 A    7/2019

*Primary Examiner* — Anthony Ho
(74) *Attorney, Agent, or Firm* — ScienBiziP, P.C.

(57) ABSTRACT

A light-emitting element includes: a first electrode; a second electrode disposed opposite the first electrode; a light-emitting layer disposed between the first electrode and the second electrode and containing quantum dots; and a carrier transport layer disposed between the first electrode and a surface of the light-emitting layer on a second electrode side, including a plurality of protrusions extending toward the second electrode side, and containing a carrier transport material, wherein at least parts of the plurality of protrusions of the carrier transport layer and at least parts of a plurality of gaps between the plurality of protrusions are covered by the quantum dots.

20 Claims, 12 Drawing Sheets

(a)

(b)

LIGHT-EMITTING ELEMENT AND METHOD OF MANUFACTURING LIGHT-EMITTING ELEMENT

TECHNICAL FIELD

The present disclosure relates to light-emitting elements and methods of manufacturing light-emitting elements.

BACKGROUND ART

Various display devices have been developed. Particularly, those display devices which include QLEDs (quantum-dot light-emitting diodes) as light-emitting elements are attracting great attention because of their feasibility for low power consumption, small thickness, high image quality, and other advantages.

However, structured QLEDs in related art fall short of delivering satisfactory luminous efficiency. There have been active research efforts to improve the luminous efficiency.

As an example, Patent Literature 1 describes a nanorod-shaped electron transport layer being formed directly on a cathode electrode.

CITATION LIST

Patent Literature

Patent Literature 1: US Patent Application Publication No. US2019/0067618A1 (Publication Date: Feb. 28, 2019)

SUMMARY

Technical Problem

However, the QLED described in Patent Literature 1 includes a light-emitting layer of quantum dots with a prescribed thickness on a nanorod-shaped electron transport layer. Therefore, the injection of electrons to the quantum dots other than those quantum dots which are close to the nanorod-shaped electron transport layer, in other words, to the quantum dots not in contact with the nanorod-shaped electron transport layer, inevitably depends on the movement of electrons between the quantum dots in the light-emitting layer by hopping conduction. Therefore, the efficiency of electron injection to the quantum dots not in contact with the nanorod-shaped electron transport layer is low, which is undesirable. In addition, the interface of the nanorod-shaped electron transport layer that is in contact with a light-emitting layer containing quantum dots is so rough that there occurs a high contact resistance between the light-emitting layer and the electron transport layer, which is also undesirable.

The present disclosure, in an aspect thereof, has been made in view of these issues and has an object to provide a light-emitting element that achieves a high efficiency in the injection of carriers to quantum dots and a low contact resistance between a light-emitting layer and a carrier transport layer and to provide a method of manufacturing such a light-emitting element.

Solution to Problem

To address these issues, a light-emitting element in accordance with the present disclosure includes: a first electrode; a second electrode disposed opposite the first electrode; a light-emitting layer disposed between the first electrode and the second electrode and containing quantum dots; and a carrier transport layer disposed between the first electrode and a surface of the light-emitting layer on a second electrode side, including a plurality of protrusions extending toward the second electrode side, and containing a first carrier transport material, wherein at least parts of the plurality of protrusions of the carrier transport layer and at least parts of a plurality of gaps between the plurality of protrusions are covered by the quantum dots.

To address the issues, a method of manufacturing a light-emitting element in accordance with the present disclosure includes: a step of forming a first electrode; a step of forming, on the first electrode, a carrier transport layer including a plurality of protrusions and containing a first carrier transport material; and a step of forming quantum dots so as to cover at least parts of the plurality of protrusions of the carrier transport layer and at least parts of a plurality of gaps between the plurality of protrusions.

Advantageous Effects of Disclosure

The present disclosure, in an aspect thereof, can provide a light-emitting element that achieves a high efficiency in the injection of carriers to quantum dots and a low contact resistance between a light-emitting layer and a carrier transport layer and provide a method of manufacturing such a light-emitting element.

DESCRIPTION OF EMBODIMENTS

Figure 1:
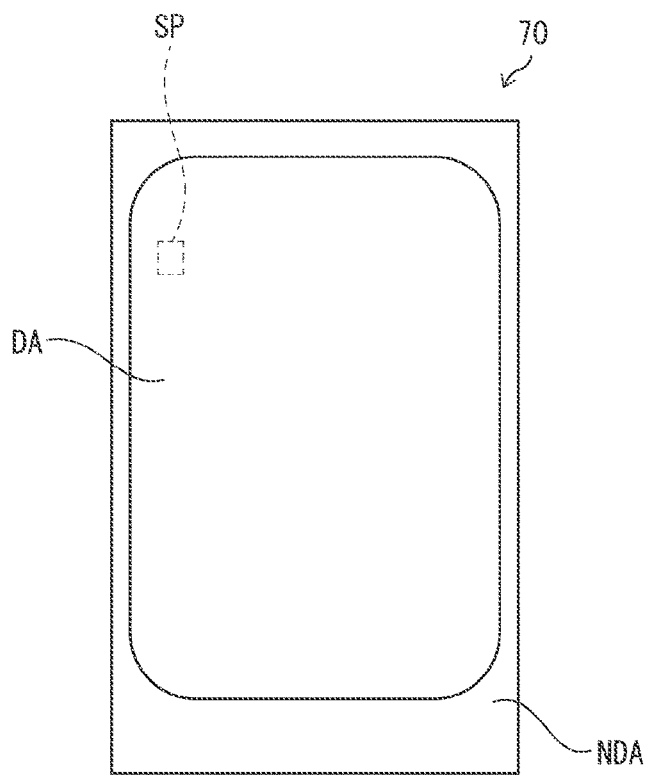
FIG. 1 is a plan view of a display device including light-emitting elements in accordance with Embodiment 1.

The following will describe embodiments of the disclosure with reference to FIGS. 1 to 13. Throughout the following, for convenience of description, members of an embodiment that have the same arrangement and function as members of another specific embodiment are indicated by the same reference numerals and description thereof may be omitted.

Embodiment 1

Figure 2:
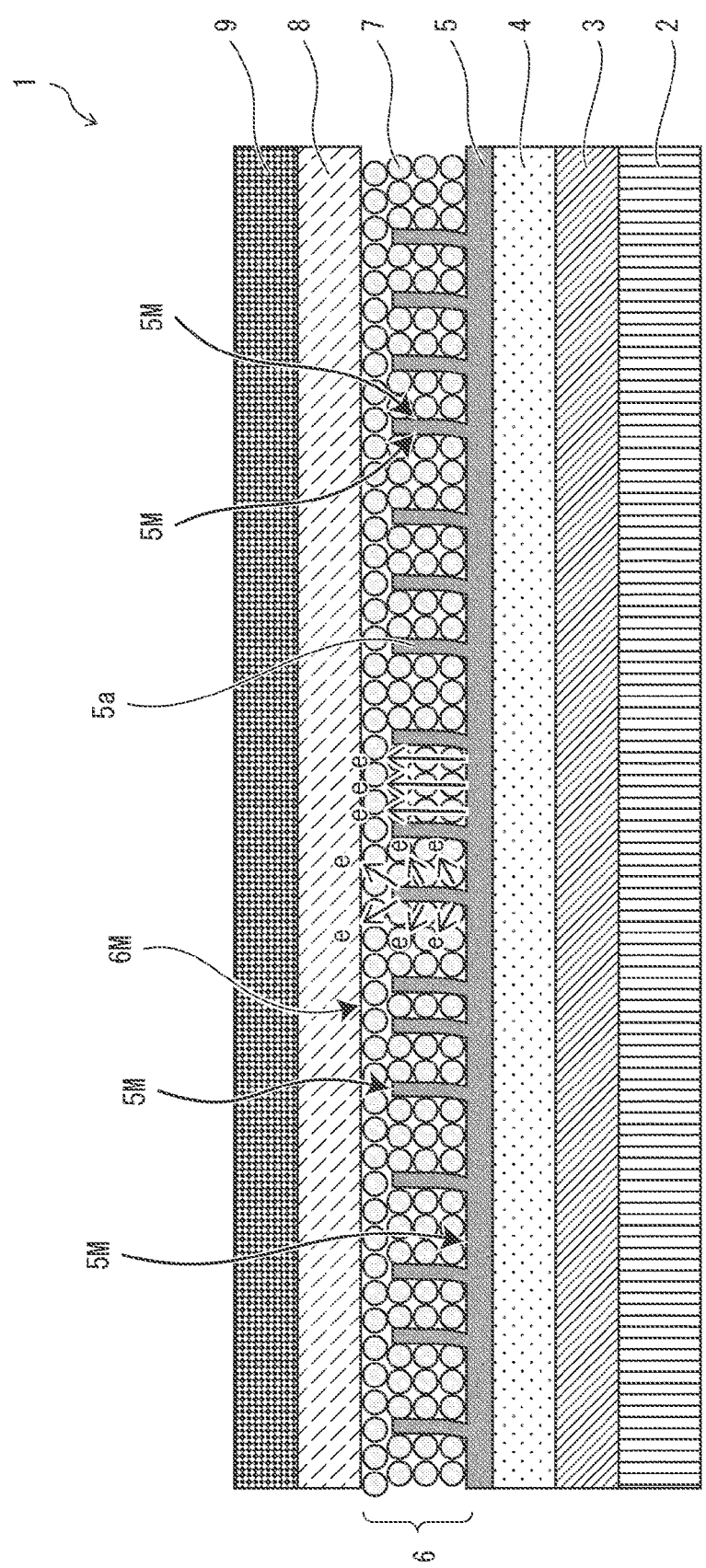
FIG. 2 is a schematic cross-sectional view of a structure of the light-emitting element in accordance with Embodiment 1.

FIG. 1 is a plan view of a display device 70 including light-emitting elements 1 (see FIG. 2).

Referring to FIG. 1, the display device 70 has a display area DA and a frame area NDA around the display area DA. The display area DA includes a plurality of subpixels SP each including a light-emitting element. Note that the present embodiment describes, as an example, a structure where each pixel includes a red subpixel, a green subpixel, and a blue subpixel, all of which are subpixels SP. This is however not the only possible implementation of the disclosure. Alternatively, the pixel may further include, for example, a white subpixel or a yellow subpixel other than the red, green, and blue subpixels.

FIG. 2 is a schematic cross-sectional view of a structure of the light-emitting element 1.

Referring to FIG. 2, the light-emitting element 1 is provided on a TFT (thin film transistor) layer 3 on a substrate 2.

The substrate 2 may be, for example, a glass substrate or a flexible substrate made primarily of a resin such as a polyimide.

The TFT layer 3 contains, for example, a plurality of thin film transistors, a plurality of capacitive elements, wiring for these components, and various insulation films.

Note that between the substrate 2 and the TFT layer 3, there may be provided a barrier layer (not show) that is an inorganic insulation layer for preventing penetration by foreign objects such as water and oxygen and that can be formed using, for example, silicon nitride or silicon oxide.

The light-emitting element 1 on the TFT layer 3 includes: a cathode (first electrode) 4; an anode 9 (second electrode) disposed opposite the cathode 4; a light-emitting layer 6, of quantum dots, disposed between the cathode 4 and the anode 9; and an electron transport layer (carrier transport layer) 5 disposed between the cathode 4 and a surface 6M of the light-emitting layer 6 on the anode 9 side and containing a plurality of protrusions 5a extending toward the anode 9 side. The electron transport layer 5 has, on the light-emitting layer 6 side, a surface 5M that includes the plurality of protrusions 5a and that is covered by quantum dots 7.

The present embodiment describes, as an example, a structure where the quantum dots 7 cover the entire protrusions 5a of the electron transport layer 5 and the entire gaps between the plurality of protrusions 5a (those parts of the base portion of the electron transport layer 5 which are exposed between the plurality of protrusions 5a), as shown in FIG. 2. This is however not the only possible implementation of the disclosure. Alternatively, the quantum dots 7 may cover parts of the plurality of protrusions 5a of the electron transport layer 5 and parts of the gaps between the plurality of protrusions 5a. In other words, the quantum dots 7 may not cover parts of the plurality of protrusions 5a of the electron transport layer 5 and parts of the gaps between the plurality of protrusions 5a.

Referring to FIG. 2, there may be further provided a hole transport layer 8 between the light-emitting layer 6 and the anode 9. Additionally, there may be provided a hole injection layer (not shown) between the hole transport layer 8 and the anode 9 where necessary.

The present embodiment describes, as an example, a structure where the electron transport layer 5 including the plurality of protrusions 5a is formed directly on the cathode 4. This is however not the only possible implementation of the disclosure. Alternatively, for example, there may be provided an electron injection layer (not shown) between the cathode 4 and the electron transport layer 5 including the plurality of protrusions 5a where necessary.

Note that the cathode 4 is electrically connected to, for example, the drain electrode of a TFT element (not shown) in the TFT layer 3 via a contact hole.

The present embodiment describes, as an example, a structure where the light-emitting element 1 is of a bottom-emission type. Accordingly, the cathode 4 may be made of, for example, ITO (indium tin oxide) to be transmissive to visible light, and the anode 9 may be made of, for example, Al or Ag to be reflective to visible light. This is however not the only possible implementation of the disclosure. Alternatively, when the light-emitting element 1 is of a top-emission type, the cathode 4 may be made of, for example, a stack of ITO and either Al or Ag, both of which are provided in this order when viewed from the electron transport layer 5, to be reflective to visible light, and the anode 9 may be made of, for example, a thin film of a metal such as Al or Ag to be transmissive to visible light.

The electron transport layer 5 including the plurality of protrusions 5a preferably contains, for example, at least one metal oxide selected from the group consisting of ZnO, $SnO_2$, $In_2O_3$, $TiO_2$, and MgO or a metal oxide obtained by doping any one of these metal oxides with at least one species of metal ions selected from Li, Na, K, Mg, and Ca.

For instance, the plurality of protrusions 5a of the electron transport layer 5 may be made of the same element as the base portion of the electron transport layer 5 (i.e., the part of the electron transport layer 5 other than the plurality of protrusions 5a). The present embodiment describes, as an example, a structure where the entire electron transport layer 5 including the plurality of protrusions 5a, namely, the plurality of protrusions 5a of the electron transport layer 5 and the base portion of the electron transport layer 5 (i.e., the part of the electron transport layer 5 other than the plurality of protrusions 5a), is made of ZnO. This is however not the only possible implementation of the disclosure. Alternatively, in the plurality of protrusions 5a of the electron transport layer 5 and the base portion of the electron transport layer 5 (i.e., the part of the electron transport layer 5 other than the plurality of protrusions 5a), the material for the plurality of protrusions 5a of the electron transport layer 5 and the material for the base portion of the electron transport layer 5 (i.e., the part of the electron transport layer 5 other than the plurality of protrusions 5a) (first carrier transport material) may each be, for example, at least one metal oxide selected from the group consisting of ZnO, $SnO_2$, $In_2O_3$, $TiO_2$, and MgO or a metal oxide obtained by doping any one of these metal oxides with at least one species of metal ions selected from Li, Na, K, Mg, and Ca. The plurality of protrusions 5a of the electron transport layer 5 may be made of a different material than the base portion of the electron transport layer 5 (i.e., the part of the electron transport layer 5 other than the plurality of protrusions 5a). For instance, the plurality of protrusions 5a of the electron transport layer 5 may be made of ZnMgO, and the base portion of the electron transport layer 5 (i.e., the part of the electron transport layer 5 other than the plurality of protrusions 5a) may be made of ZnO.

In addition, the material for the plurality of protrusions 5a of the electron transport layer 5 and the material for the base portion of the electron transport layer 5 (i.e., the part of the electron transport layer 5 other than the plurality of protrusions 5a) have a shape that is not limited in any particular manner. The shape may be a series of films or particulate.

Referring to FIG. 2, the light-emitting element 1 in accordance with the present embodiment includes the electron transport layer 5 including the plurality of protrusions 5a made entirely of ZnO. The electron transport layer 5 is disposed between the cathode 4 and the surface 6M of the light-emitting layer 6 on the anode 9 side and includes the plurality of protrusions 5a extending toward the anode 9 side.

The present embodiment describes a structure where the plurality of protrusions 5a of the electron transport layer 5 have a columnar shape (wire shape), which is an example of a rod shape. This is however not the only possible implementation of the disclosure. Alternatively, as an example, the plurality of protrusions 5a may have a polygonal prism shape, such as a triangular prism shape, a quadrangular prism shape, or an N-gonal prism shape (N is a natural number greater than or equal to 5), which is an example of a rod shape. Additionally, the shape of the plurality of protrusions 5a is not necessarily limited to a rod shape so long as the plurality of protrusions 5a have such a shape as to extend from parts of the electron transport layer 5 that are in contact with the cathode 4 toward the anode 9 side. The plurality of protrusions 5a may have, for example, such a shape as to have a width of two or more rod-shaped protrusions 5a combined. In addition, the present embodiment describes a structure where all the plurality of protrusions 5a have the same shape. Alternatively, not all the plurality of protrusions 5a may have the same shape.

In the present embodiment, the plurality of protrusions 5a have a columnar shape (wire shape) with a view to the plurality of protrusions 5a isotropically and more uniformly feeding electrons e to the quantum dots 7 covering the plurality of protrusions 5a, to increase the injection efficiency of electrons e to the quantum dots 7. This is however not the only possible implementation of the disclosure. Alternatively, for example, the plurality of protrusions 5a may have a regular N-gonal prism shape (N is a natural number greater than or equal to 3).

Figure 3:
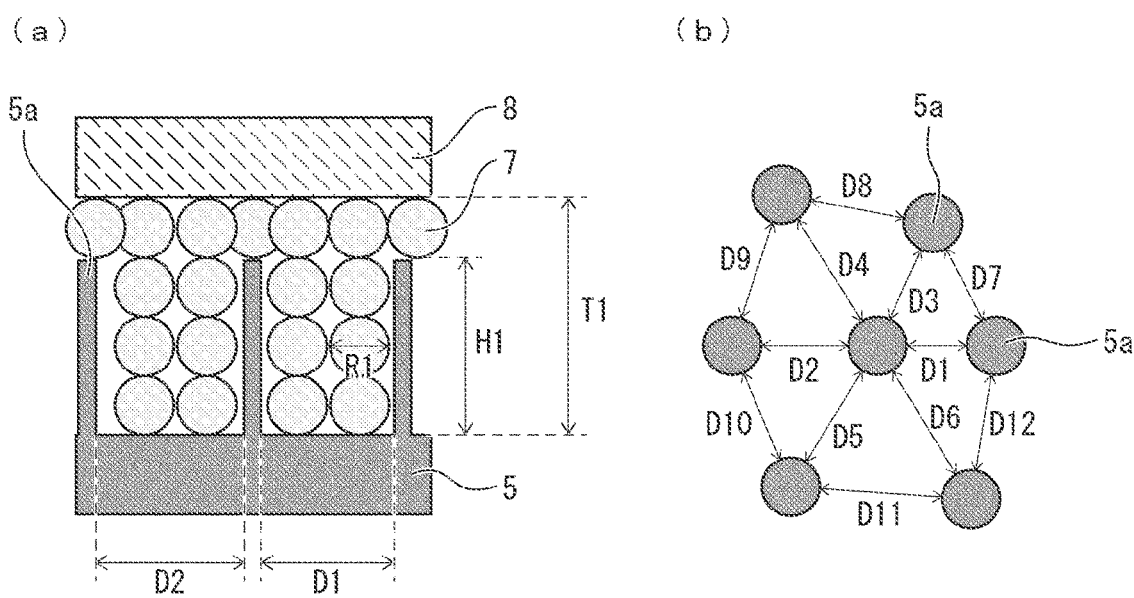
In FIG. 3, (a) is a diagram showing a relationship between the thickness of a light-emitting layer and the height of protrusions of an electron transport layer in the light-emitting element in accordance with Embodiment 1, and (b) is a diagram showing an arrangement of the protrusions of the electron transport layer in the light-emitting element in accordance with Embodiment 1.

Note that the diameter of the plurality of column-shaped (wire-shaped) protrusions 5a in a cross-section taken perpendicular to the length direction thereof is preferably greater than or equal to the particle diameter of the quantum dots 7 and less than or equal to a thickness T1 of the light-emitting layer 6 containing the quantum dots 7 (see (a) of FIG. 3). As a preferred example, the diameter of the protrusions 5a in a cross-section taken perpendicular to the length direction thereof is from 1 nm to 100 nm, both inclusive. In the present embodiment, the plurality of protrusions 5a are formed so as to have a diameter of approximately 50 nm in a cross-section taken perpendicular to the length direction of the protrusions 5a. This is however not the only possible implementation of the disclosure.

Referring to FIG. 2, the electron transport layer 5 including the plurality of protrusions 5a is provided on the cathode 4, and the quantum dots 7 in the light-emitting layer 6 are provided on the electron transport layer 5 so as to cover the plurality of protrusions 5a and the gaps between the plurality of protrusions 5a. In addition, there may be provided an electron injection layer between the electron transport layer 5 and the cathode 4 as described above, so that the electron transport layer 5 can be provided on the electron injection layer. Accordingly, the quantum dots 7 do not come into direct contact with the cathode 4, and electrons e are injected to the quantum dots 7 via the electron transport layer 5. The light-emitting element 1 in accordance with the present embodiment can hence restrain decreases in the efficiency of electron injection caused by the quantum dots 7 coming into direct contact with the cathode 4. Additionally, the light-emitting element 1 in accordance with the present embodiment has a low contact resistance between the light-emitting layer 6 and the electron transport layer 5 because the quantum dots 7 are also present in the gaps between the plurality of protrusions 5a in the light-emitting element 1.

Referring to FIG. 2, in the light-emitting element 1 in accordance with the present embodiment, the injection of electrons e to the quantum dots 7 in the gaps between the plurality of protrusions 5a is done by direct feeding of electrons e from the plurality of protrusions 5a where electrons e have higher mobility than the movement of the electrons e by hopping conduction, as well as by the movement of the electrons e by hopping conduction between the quantum dots 7. Additionally, the injection of electrons e to the quantum dots 7 on the plurality of protrusions 5a that are far from the cathode 4, which is an electrode where electrons are injected, that is, to the quantum dots 7 close to the hole transport layer 8, is done similarly to the above by direct feeding of electrons e from the plurality of protrusions 5a where electrons e have higher mobility than the movement of the electrons e by hopping conduction, as well as by the movement of the electrons e by hopping conduction between the quantum dots 7. The resultant light-emitting element 1 exhibits high efficiency in injection of electrons e to the quantum dots 7. Note that the electronic mobility is higher in the protrusions 5a of the ZnO-composed electron transport layer 5 (e.g., approximately from $10^1$ to $10^2$ $cm^2/Vs$) than between the quantum dots 7 by hopping conduction (e.g., approximately from $10^{-4}$ to $10^{-3}$ $cm^2/Vs$).

In the display device 70 shown in FIG. 1, at least one of the red, green, and blue subpixels that are the subpixels SP that constitute one pixel needs only to be a light-emitting element (QLED) 1 like the one shown in FIG. 2. The present embodiment describes, as an example, a structure where each of the red, green, and blue subpixels that are the three subpixels SP that constitute one pixel is the light-emitting element (QLED) 1 like the one shown in FIG. 2. This is however not the only possible implementation of the disclosure. Alternatively, for instance, only one of the red, green, and blue subpixels is the light-emitting element (QLED) 1 like the one shown in FIG. 2, and the remaining two are OLEDs (organic light-emitting diode). Additionally, only one of the red, green, and blue subpixels is an OLED, and the remaining two are the light-emitting elements (QLED) 1 like the one shown in FIG. 2.

The light-emitting element (QLED) 1 includes the light-emitting layer 6 containing the quantum dots 7 as a light-emitting layer. An OLED is a light-emitting element including an organic light-emitting layer as a light-emitting layer.

The quantum dots 7, although not limited in any particular manner, may be structured, for example, so as to include a core and a shell. In the present embodiment, the quantum dots 7 are used in which the core is made of CdSe and the shell is made of ZnS. This is however not the only possible implementation of the disclosure. Alternatively, for instance, for example, the quantum dots of any of the core/shell types, including CdSe/CdS, CdSe/ZnS, InP/ZnS, CIGS/ZnS, CdSe/ZnSe, and InP/ZnSe, may be used.

Note that the light-emitting elements (QLED) for red subpixels, the light-emitting elements (QLED) for green subpixels, and the light-emitting elements (QLED) for blue subpixels may include, in the light-emitting layer thereof, quantum dots that have different particle diameters or quantum dots of different types, to emit light of different peak wavelengths. The light-emitting elements (QLED) for red subpixels emit light with a longer peak wavelength than do the light-emitting elements (QLED) for green subpixels. The light-emitting elements (QLED) for green subpixels emit light with a longer peak wavelength than do the light-emitting elements (QLED) for blue subpixels.

In the present embodiment, the hole transport layer 8 is made of poly-TPD. This is however not the only possible implementation of the disclosure. Alternatively, for example, the hole transport layer 8 may be made of, for example, TAPC, TPD, NPB, or α-NPD.

FIG. 3, in (a), shows a relationship between the thickness T1 of the light-emitting layer 6 containing the quantum dots 7 in the light-emitting element 1 shown in FIG. 2 and a height H1 of the protrusions 5a of the electron transport layer 5 in the light-emitting element 1.

As shown in (a) of FIG. 3, the present embodiment describes, as an example, a structure where the protrusions 5a and the light-emitting layer 6 are provided in such a manner that the height H1 of the protrusions 5a covered by the quantum dots 7 is equal to 75% the thickness T1 of the light-emitting layer 6 containing the quantum dots 7. This is however not the only possible implementation of the disclosure. Alternatively, the protrusions 5a and the light-emitting layer 6 are preferably provided in such a manner that the height H1 of the protrusions 5a covered by the quantum dots 7 is less than or equal to 75% the thickness T1 of the light-emitting layer 6 containing the quantum dots 7, with a view to reliably prevent the protrusions 5a of the electron transport layer 5 from coming into direct contact with the hole transport layer 8. Meanwhile, in view of the injection efficiency of electrons e to the quantum dots 7, the protrusions 5a and the light-emitting layer 6 are preferably provided in such a manner that the height H1 of the protrusions 5a covered by the quantum dots 7 is greater than or equal to 25% the thickness T1 of the light-emitting layer 6 containing the quantum dots 7 and more preferably provided in such a manner that the height H1 of the protrusions 5a covered by the quantum dots 7 is greater than or equal to 50% the thickness T1 of the light-emitting layer 6 containing the quantum dots 7.

Note that the height H1 of the protrusions 5a covered by the quantum dots 7 and the thickness T1 of the light-emitting layer 6 can be measured by, for example, transmission electron microscopy. The height H1 of the protrusions 5a is obtained by measuring the heights of one hundred randomly selected protrusions 5a and calculating an average value of these height measurements. The thickness T1 of the light-emitting layer 6 is obtained by measuring the thickness of the light-emitting layer 6 at one hundred randomly selected sites and calculating an average value of these thickness measurements. Thereafter, the height H1 of the protrusions 5a and the thickness T1 of the light-emitting layer 6 are compared.

FIG. 3, in (b), is a diagram showing an arrangement of the protrusions 5a of the electron transport layer 5 in the light-emitting element 1 shown in FIG. 2.

Referring to (b) of FIG. 3, in the present embodiment, the protrusions 5a of the electron transport layer 5 are arranged irregularly. This is however not the only possible implementation of the disclosure. Alternatively, the protrusions 5a of the electron transport layer 5 may be arranged regularly as will be described later in Embodiment 2. Since the plurality of protrusions 5a of the electron transport layer 5 are arranged irregularly in the present embodiment, the distances D1 to D12 separating two adjacent protrusions 5a of the plurality of protrusions 5a of the electron transport layer 5 can differ as shown in (b) of FIG. 3. In such cases, the distance D1 separating the two closest protrusions 5a of all the plurality of protrusions 5a of the electron transport layer 5 is preferably larger than the particle diameter R1 of the quantum dots 7. This structure enables the entire gaps between the plurality of protrusions 5a of the electron transport layer 5 to be covered by the quantum dots 7 as shown in FIG. 2, thereby enabling improving the injection efficiency of electrons e to the quantum dots 7 and lowering contact resistance between the light-emitting layer 6 and the electron transport layer 5.

The distance D1 separating the two closest protrusions 5a of all the plurality of protrusions 5a of the electron transport layer 5 may be larger than twice the particle diameter R1 of the quantum dots 7.

Note that since the distance D1 separating the two closest protrusions 5a of all the plurality of protrusions 5a of the electron transport layer 5 is preferably less than or equal to the thickness T1 of the light-emitting layer 6 containing the quantum dots 7, the distance D1 is preferably from 2 nm to 100 nm, both inclusive.

Note that the distances D1 to D12 between two adjacent protrusions 5a and the particle diameter R1 of the quantum dots 7 can be verified in a transmission electron microscopy image of a horizontal cross-section of the light-emitting layer 6 as in contrast with the thickness T1 direction of the light-emitting layer 6. In addition, the distance D1 between the two closest protrusions 5a can be determined by a similar method, to verify the presence/absence of the quantum dots 7 between these two closest protrusions 5a. For instance, the particle diameter R1 of the quantum dots 7 can be measured in a transmission electron microscopy image, as described in the following. First, one hundred particles are randomly selected, and the short and long diameters of each particle are measured. Subsequently, an average value of the short and long diameters is calculated for each particle as the diameter of the particle. Finally, an average of the diameters of all the particles is calculated to obtain a value as the particle diameter of the quantum dots 7.

In addition, the distances D1 to D12 between two adjacent protrusions 5a of the plurality of protrusions 5a of the electron transport layer 5 are preferably all less than or equal to the thickness T1 of the light-emitting layer 6 containing the quantum dots 7.

In addition, the plurality of protrusions 5a of the electron transport layer 5 preferably have a density of from $2 \times 10^9$ protrusions/cm$^2$ to $7 \times 10^{12}$ protrusions/cm$^2$, both inclusive, with a view to further improvement of the injection efficiency of electrons e to the quantum dots 7 and the quantum dots 7 covering the entire gaps between the plurality of protrusions 5a of the electron transport layer 5.

Note that the density of the plurality of protrusions 5a of the electron transport layer 5 can be verified by observing a horizontal cross-section of the light-emitting layer 6 as in contrast with the thickness T1 direction of the light-emitting layer 6 in a TEM image and counting the number of the protrusions 5a within a range in the TEM image.

Figure 4:
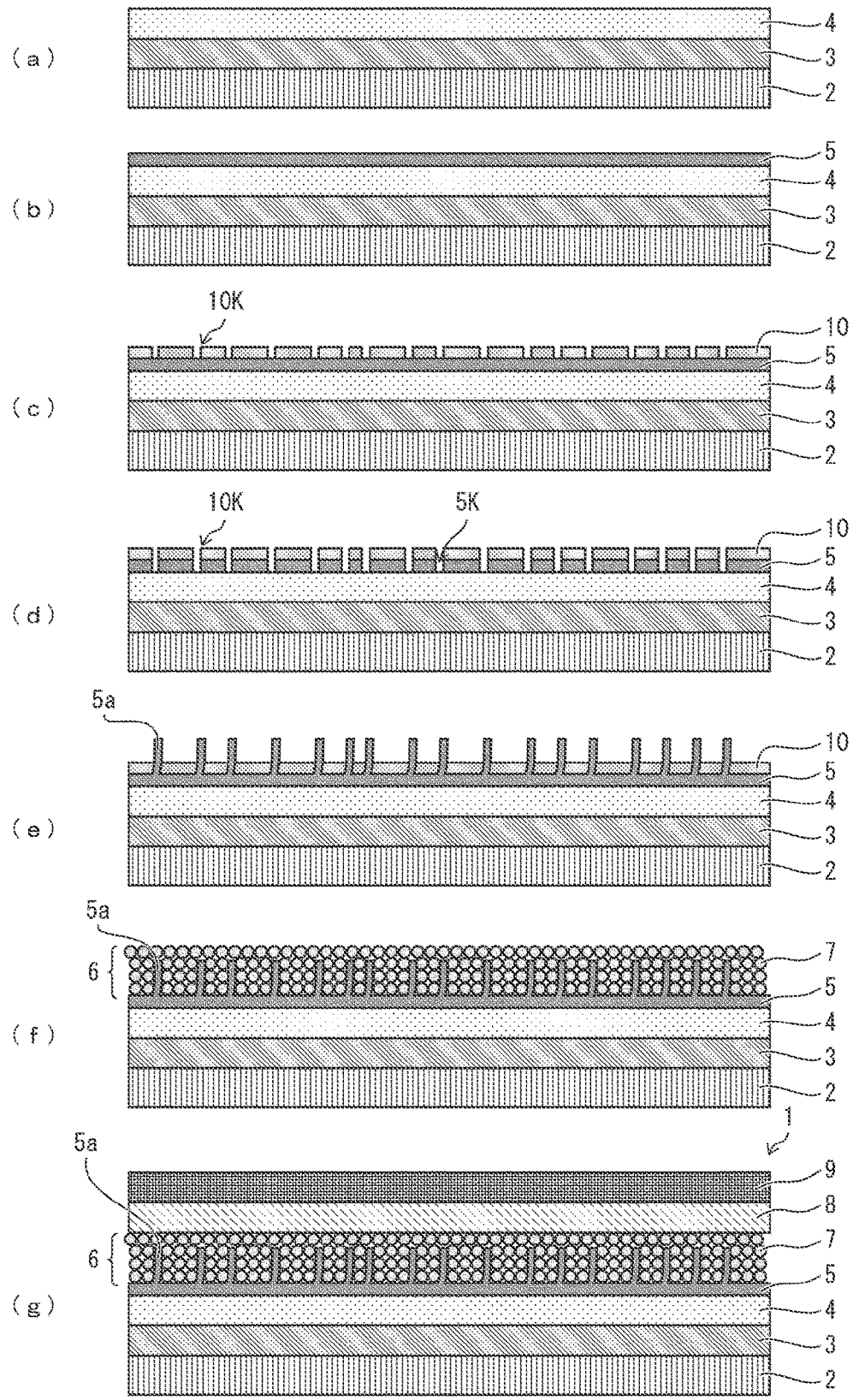
In FIG. 4, (a), (b), (c), (d), (e), (f), and (g) are diagrams illustrating steps of manufacturing a light-emitting element in accordance with Embodiment 1.
Figure 5:
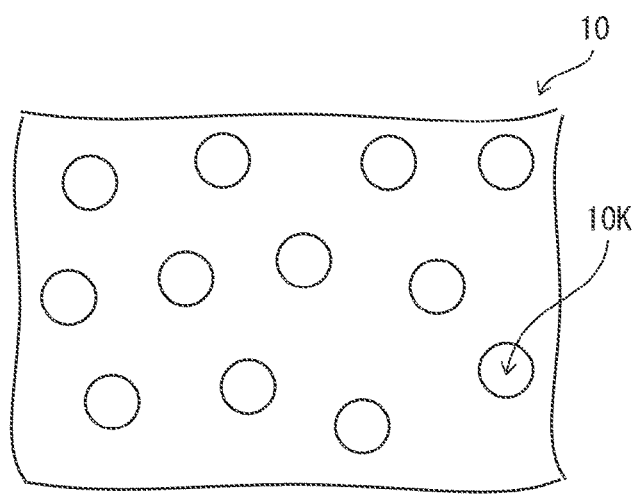
FIG. 5 is a plan view of a resist layer shown in (c) of FIG. 4.

Portions (a) to (g) of FIG. 4 are diagrams illustrating steps of manufacturing the light-emitting element 1. FIG. 5 is a plan view of a resist layer 10 shown in (c) of FIG. 4.

First, as shown in (a) of FIG. 4, the cathode 4 is formed on the TFT layer 3 in the substrate 2. The cathode 4 is formed of ITO to a thickness of 30 nm by sputtering in the present embodiment. The cathode 4 may be formed of any material to any thickness by any method. Note that the present embodiment describes, as an example, a structure where the cathode 4 is formed as an insular electrode and electrically connected to, for example, the drain electrode of a TFT element (not shown) in the TFT layer 3 via a contact hole. This is however not the only possible implementation of the disclosure. Alternatively, for instance, the cathode 4 may be a common electrode formed as a single common layer in the display area DA of the display device 70 shown in FIG. 1.

Next, as shown in (b) of FIG. 4, the base portion of the electron transport layer 5 is formed on the cathode 4. In the present embodiment, the base portion of the electron transport layer 5 is formed of ZnO to a thickness of 50 nm by sputtering. The base portion of the electron transport layer 5 may be formed of any material to any thickness by any method, but preferably contains, for example, at least one metal oxide selected from the group consisting of ZnO, SnO$_2$, In$_2$O$_3$, TiO$_2$, and MgO or a metal oxide obtained by doping any one of these metal oxides with at least one species of metal ions selected from Li, Na, K, Mg, and Ca.

Subsequently, as shown in (c) of FIG. 4, the resist layer 10 having through holes 10K is formed on the base portion of the electron transport layer 5. In the present embodiment, the resist layer 10 having the through holes 10K is formed using a positive photosensitive resist. This is however not the only possible implementation of the disclosure. Alternatively, for example, the resist layer 10 having the through holes 10K may be formed using a negative photosensitive resist or a non-photosensitive resist. In the present embodiment, since the protrusions 5a of the electron transport layer 5 are arranged irregularly, the through holes 10K in the resist layer 10 are also arranged irregularly as shown in FIG. 5. Note that since the distance D1 separating the two closest protrusions 5a of all the plurality of protrusions 5a of the electron transport layer 5 is preferably larger than the particle diameter R1 of the quantum dots 7 as described above, the distance separating the two closest through holes 10K of all the plurality of through holes 10K in the resist layer 10 is also preferably larger than the particle diameter R1 of the quantum dots 7. In addition, since the distance D1 separating the two closest protrusions 5a of all the plurality of protrusions 5a of the electron transport layer 5 may be larger than twice the particle diameter R1 of the quantum dots 7 as described above, the distance separating the two closest through holes 10K of all the plurality of through holes 10K in the resist layer 10 may also be larger than twice the particle diameter R1 of the quantum dots 7. In addition, since the distance D1 separating the two closest protrusions 5a of all the plurality of protrusions 5a of the electron transport layer 5 is preferably less than or equal to the thickness T1 of the light-emitting layer 6 containing the quantum dots 7, and the distance D1 is preferably from 2 nm to 100 nm, both inclusive as described above, the distance separating the two closest through holes 10K of all the plurality of through holes 10K in the resist layer 10 is also preferably from 2 nm to 100 nm, both inclusive.

In addition, the diameter of the plurality of column-shaped (wire-shaped) protrusions 5a of the electron transport layer 5 in a cross-section taken perpendicular to the length direction thereof is preferably greater than or equal to the particle diameter of the quantum dots 7 and less than or equal to the thickness T1 of the light-emitting layer 6 containing the quantum dots 7. As a preferred example, the diameter of the plurality of protrusions 5a in a cross-section taken perpendicular to the length direction thereof is from 1 nm to 100 nm, both inclusive. Therefore, the diameter of the plurality of through holes 10K in the resist layer 10 is also preferably from 1 nm to 100 nm, both inclusive. In the present embodiment, since the plurality of protrusions 5a are formed so as to have a diameter of approximately 50 nm in a cross-section taken perpendicular to the length direction of the plurality of protrusions 5a, the plurality of through holes 10K with a diameter of approximately 50 nm are formed in the resist layer 10.

Note that in the step of forming the resist layer 10 having the above-described through holes 10K, for example, the intervals at which the through holes 10K are disposed and the size of the through holes 10K can be suitably adjusted in a suitable manner in view of step margins in the step of etching the base portion of the electron transport layer 5 using the plurality of through holes 10K in the resist layer 10 in the post-processing.

Then, as shown in (d) of FIG. 4, a plurality of openings 5K are formed in the base portion (first carrier transport layer) of the electron transport layer 5. The plurality of openings 5K are formed in the base portion of the electron transport layer 5 by, for example, dry etching of the base portion of the electron transport layer 5 overlapping the plurality of through holes 10K in the resist layer 10 by using the plurality of through holes 10K in the resist layer 10. In the present embodiment, the plurality of openings 5K are formed in the base portion of the electron transport layer 5 by dry etching. This is however not the only possible implementation of the disclosure. Alternatively, the plurality of openings 5K may be formed in the base portion of the electron transport layer 5 by wet etching.

Subsequently, as shown in (e) of FIG. 4, the plurality of protrusions 5a of the electron transport layer 5 are formed by forming ZnO, which is an electron transport material (second carrier transport material), in the plurality of openings 5K in the base portion (first carrier transport layer containing a first carrier transport material) of the electron transport layer 5. Similarly to the electron transport material in the base portion of the electron transport layer (first carrier transport material), the electron transport material forming the protrusions 5a (second carrier transport material) contains at least one metal oxide selected from the group consisting of ZnO, SnO$_2$, In$_2$O$_3$, TiO$_2$, and MgO or a metal oxide obtained by doping any one of these metal oxides with at least one species of metal ions selected from Li, Na, K, Mg, and Ca.

The present embodiment describes the plurality of protrusions 5a of the electron transport layer 5 being formed by electrochemical deposition using the cathode 4 (see, for example, Journal of Photochemistry and Photobiology A: Chemistry 211 (2010) 65). A 0.2 mM aqueous solution of zinc chloride is used as an electrolytic solution in the step of forming the plurality of protrusions 5*a* of the electron transport layer 5 by electrochemical deposition using the cathode 4 in accordance with the present embodiment. This is however not the only possible implementation of the disclosure. Alternatively, the electrolytic solution may be, for example, an aqueous solution of zinc nitrate or an aqueous solution of zinc acetate. In addition, in the present embodiment, the step temperature is set to 85° C., oxygen is supplied to the electrolytic solution for bubbling since before the electrochemical deposition is started, and oxygen is supplied to the electrolytic solution for bubbling also during the electrochemical deposition. Then, the cathode 4 is set to a constant potential (e.g., constant voltage of −1 V) to perform electrochemical deposition. Note that the above-described step temperature, oxygen supply duration, and constant potential level, among others, may be modified in a suitable manner where necessary. The duration of the electrochemical deposition may be adjusted in accordance with the height (length) of the plurality of protrusions 5*a* of the electron transport layer 5. Note that after electrochemical deposition, chloride salts and unreacted materials can be removed from the surface by, for example, rinsing in, for example, pure water. Note that in the present embodiment, since the post-process includes the step of lifting off the resist layer 10, and this step of lifting off the resist layer 10 can also remove chloride salts and unreacted materials from the surface, this rinse step may be omitted where appropriate.

Note that in the present embodiment, the plurality of protrusions 5*a* of the electron transport layer 5 are formed using ZnO for the following reasons. ZnO has only a hexagonal wurtzite crystal structure in which crystal growth rates are high in a single axial direction (c-axis direction). Therefore, by forming the plurality of protrusions 5*a* using ZnO, the resultant protrusions 5*a* have a high degree of straightness, and it takes less time to perform electrochemical deposition.

The description has so far described the plurality of protrusions 5*a* of the electron transport layer 5 being formed by electrochemical deposition using the cathode 4. This is however not the only possible implementation of the disclosure. Alternatively, the plurality of protrusions 5*a* of the electron transport layer 5 can be formed by, for example, catalyst-free thermal vapor deposition (see, for example, Superlattices and Microstructures 92 (2016) 68), chemical bath deposition (see, for example, JOURNAL OF DISPLAY TECHNOLOGY 11, 430 (2015)), or pulse laser deposition (PLD). Furthermore, the plurality of protrusions 5*a* of the electron transport layer 5 may be formed by anisotropic etching using, for example, KOH (potassium hydroxide) as will be described later in Embodiment 4.

Subsequently, as shown in (f) of FIG. 4, after the resist layer 10 is lifted off, the light-emitting layer 6 containing the quantum dots 7 is formed by, for example, applying the quantum dots 7 dispersed in a medium and then removing the medium in, for example, a thermal process. In the present embodiment, the light-emitting layer 6 containing the quantum dots 7 is formed so that the quantum dots 7 can cover the entire protrusions 5*a* of the electron transport layer 5 and the entire gaps between the plurality of protrusions 5*a* (those parts of the base portion of the electron transport layer 5 which are exposed between the plurality of protrusions 5*a*).

Finally, as shown in (g) of FIG. 4, poly-TPD is, for example, applied to form, as the hole transport layer 8, a film thereof to a prescribed thickness on the light-emitting layer 6 containing the quantum dots 7. Thereafter, a film of Al is formed, as the anode 9, to a thickness of 100 nm on the hole transport layer 8 by, for example, vapor deposition or sputtering. Note that, for example, a sealing layer may be formed on the anode 9 where necessary.

The light-emitting element 1 can be hence manufactured with a high injection efficiency of electrons e to the quantum dots 7 and a low contact resistance between the light-emitting layer 6 and the electron transport layer 5.

Embodiment 2

Figure 6:
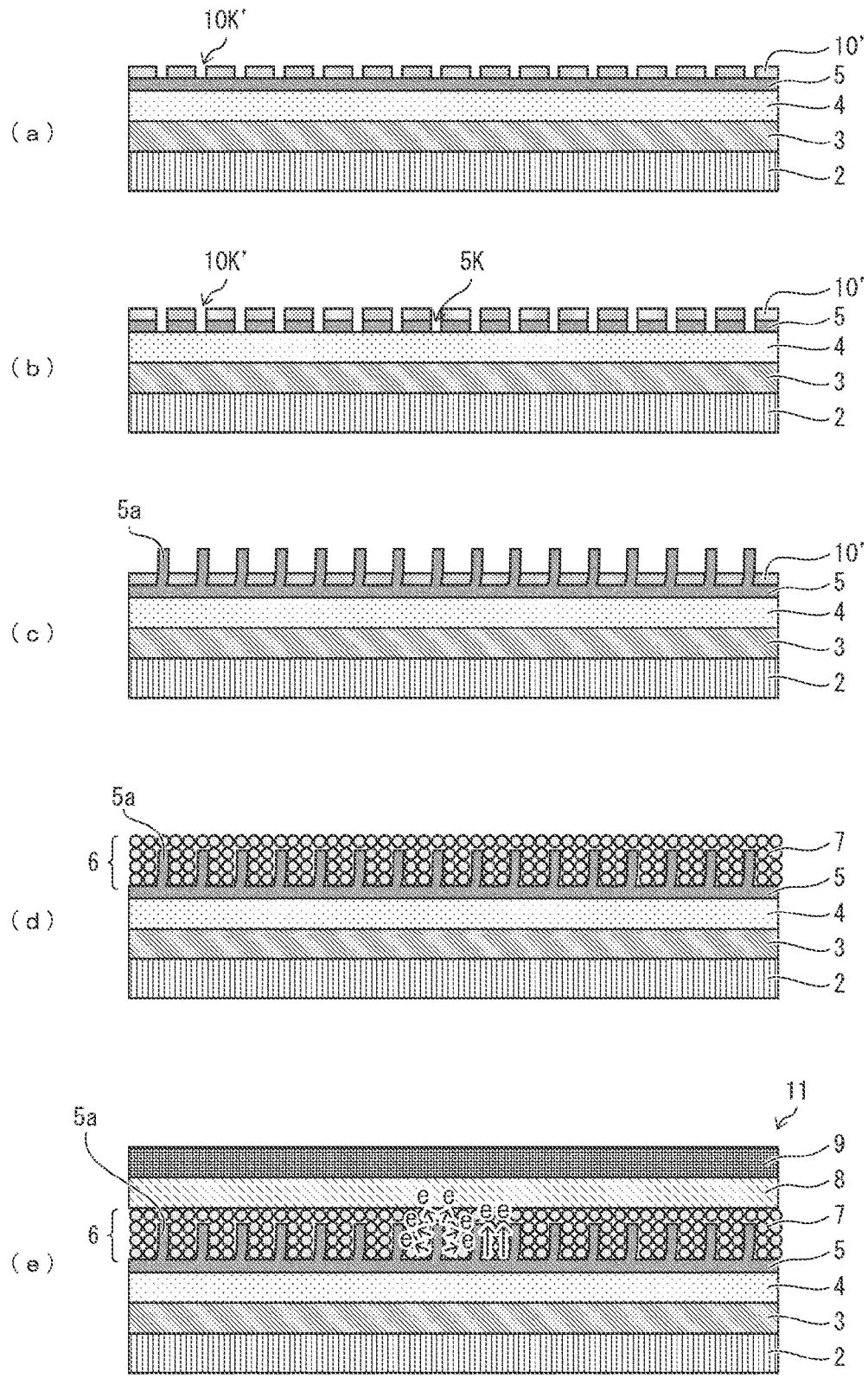
In FIG. 6, (a), (b), (c), (d), and (e) are schematic diagrams illustrating steps of manufacturing a light-emitting element in accordance with Embodiment 2 and a structure of the light-emitting element.
Figure 7:
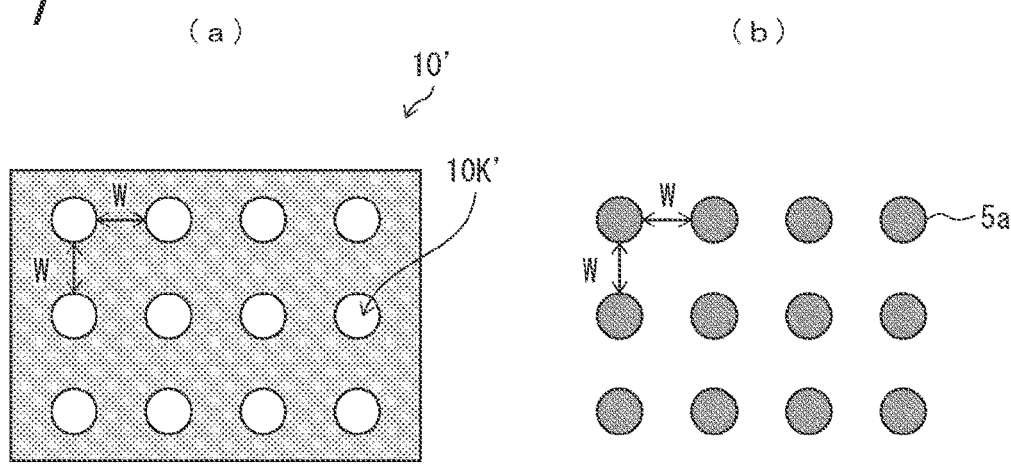
In FIG. 7, (a) is a plan view of a resist layer shown in (b) of FIG. 6, and (b) is a diagram showing an arrangement of protrusions of an electron transport layer in the light-emitting element in accordance with Embodiment 2.
Figure 8:
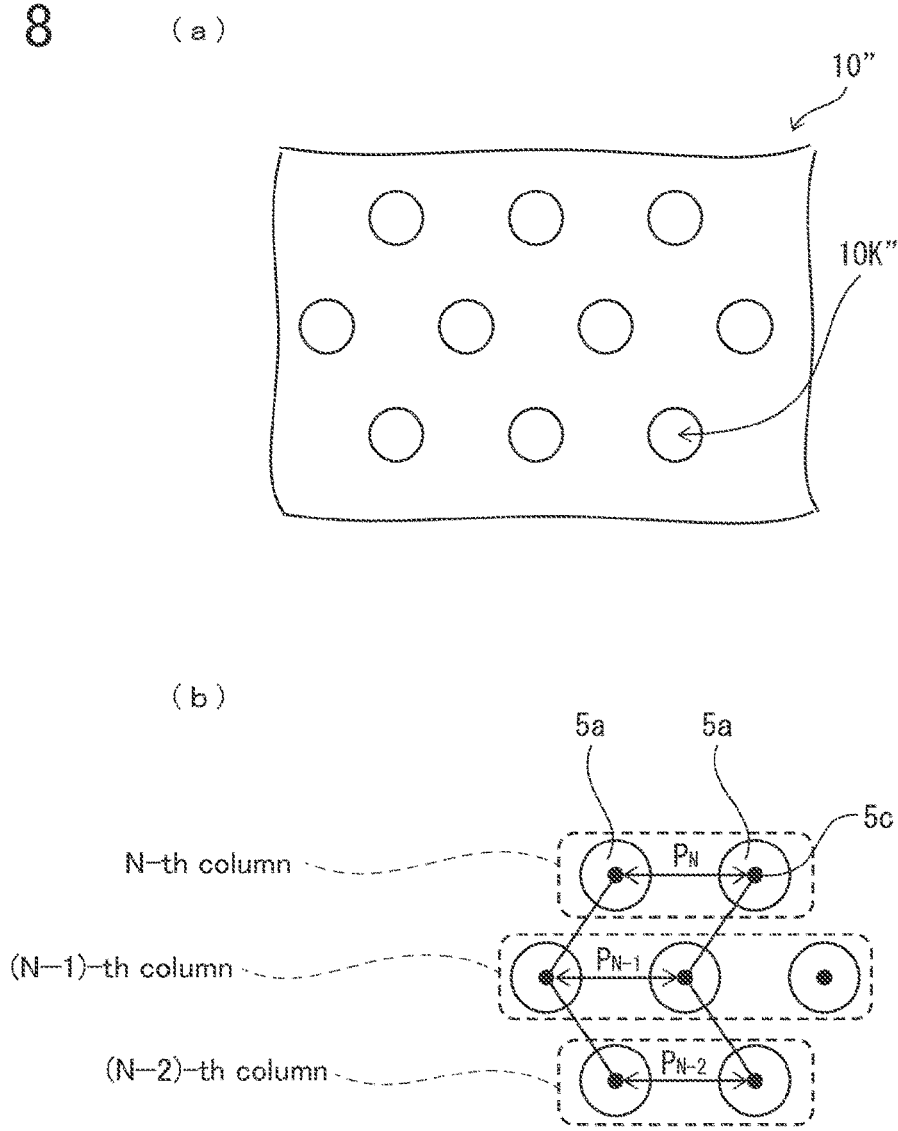
In FIG. 8, (a) is a plan view of a resist layer formed in a step of manufacturing a light-emitting element that is a variation example of Embodiment 2, and (b) is a diagram showing an arrangement of protrusions of an electron transport layer in the light-emitting element that is a variation example of Embodiment 2.

A description is given next of Embodiment 2 of the disclosure with reference to FIGS. 6 to 8. Embodiment 2 differs from Embodiment 1 in that the plurality of protrusions 5*a* of the electron transport layer 5 are regularly arranged in a light-emitting element 11 in accordance with the present embodiment. Embodiment 2 is otherwise the same as Embodiment 1. For convenience of description, members of the present embodiment that have the same function as members shown in the drawings for Embodiment 1 above are indicated by the same reference numerals, and description thereof is omitted.

Portions (a) to (e) of FIG. 6 are schematic diagrams illustrating steps of manufacturing the light-emitting element 11 and a structure of the light-emitting element 11.

Portion (a) of FIG. 7 is a plan view of a resist layer 10' shown in (b) of FIG. 6, and (b) of FIG. 7 is a diagram showing an arrangement of the protrusions 5*a* of the electron transport layer 5 in the light-emitting element 11.

Note that Embodiment 1 has already described up to the step of forming the base portion of the electron transport layer 5 on the cathode 4, and description thereof is omitted.

As shown in (a) of FIG. 6, the resist layer 10' having through holes 10K' is formed on the base portion of the electron transport layer 5. In the present embodiment, the plurality of protrusions 5*a* of the electron transport layer 5 are formed in a regular arrangement, for example, in the vertical and lateral directions with equal intervals of distance W as shown in (b) of FIG. 7. Therefore, the resist layer 10' having the plurality of through holes 10K' formed in the vertical and lateral directions with equal intervals of distance W is formed on the base portion of the electron transport layer 5 as shown in (a) of FIG. 7.

Then, the plurality of openings 5K are formed in the base portion of the electron transport layer 5 (first carrier transport layer containing a first carrier transport material) as shown in (b) of FIG. 6. The plurality of openings 5K are formed in the base portion of the electron transport layer 5 by, for example, dry etching of those parts of the base portion of the electron transport layer 5 which overlap the plurality of through holes 10K' in the resist layer 10' by using the plurality of through holes 10K' in the resist layer 10'.

Subsequently, as shown in (c) of FIG. 6, the electron transport layer 5 including the plurality of protrusions 5*a* regularly arranged as shown in (b) of FIG. 7 is formed by forming ZnO, which is an electron transport material (second carrier transport material), in the plurality of openings 5K in the base portion (first carrier transport layer containing first carrier transport material) of the electron transport layer 5. In the present embodiment, the electron transport layer 5 including the plurality of protrusions 5*a* is formed similarly by forming the plurality of protrusions 5a regularly arranged as shown in (b) of FIG. 7 by electrochemical deposition using the cathode 4.

Subsequently, as shown in (d) of FIG. 6, after the resist layer 10' is lifted off, the light-emitting layer 6 containing the quantum dots 7 is formed by, for example, applying the quantum dots 7 dispersed in a medium and then removing the medium in, for example, a thermal process.

Finally, as shown in (e) of FIG. 6, poly-TPD is, for example, applied to form, as the hole transport layer 8, a film thereof to a prescribed thickness on the light-emitting layer 6 containing the quantum dots 7. Thereafter, a film of Al is formed, as the anode 9, to a thickness of 100 nm on the hole transport layer 8 by, for example, vapor deposition or sputtering. Note that, for example, a sealing layer may be formed on the anode 9 where necessary.

The light-emitting element 11 shown in (e) of FIG. 6 injects electrons e to the quantum dots 7 via the electron transport layer 5 including the plurality of protrusions 5a regularly arranged as shown, for example, in (b) of FIG. 7, thereby being capable of more uniformly injecting electrons e to the quantum dots 7 across the light-emitting element. In addition, the resultant light-emitting element 11 exhibits a high injection efficiency of electrons e to the quantum dots 7 and a low contact resistance between the light-emitting layer 6 and the electron transport layer 5.

Portion (a) of FIG. 8 is a plan view of a resist layer 10" formed in a step of manufacturing a light-emitting element that is a variation example of Embodiment 2. Portion (b) of FIG. 8 is a diagram showing an arrangement of the protrusions 5a of the electron transport layer 5 in the light-emitting element that is a variation example of Embodiment 2.

The plurality of protrusions 5a of the electron transport layer 5 in the above-described light-emitting element 11 include N columns (N is an integer greater than or equal to 2) each including two or more protrusions 5a as shown in (b) of FIG. 7. These two or more protrusions 5a in each column have pitches aligned between two adjacent columns of the N columns. On the other hand, between two adjacent columns in the case of the protrusions 5a of the electron transport layer 5 in the light-emitting element that is a variation example of Embodiment 2 shown in (b) of FIG. 8 (e.g., between the N-th column and the (N−1)-th column), a pitch $P_N$ of the protrusions 5a in the N-th column is out of alignment with a pitch $P_{N-1}$ of the protrusions 5a in the (N−1)-th column in the left and right direction in the drawing. Note that in the drawing, the out-of-alignment levels of the pitches in the left and right direction are approximately equal. Note that the pitches $P_N$, $P_{N-1}$, $P_{N-2}$ represent a distance between the centers 5c of two adjacent protrusions 5a in each column.

When the electron transport layer 5 including the plurality of protrusions 5a regularly arranged as shown in (b) of FIG. 8 is provided, since electrons e are injected to the quantum dots 7 via the electron transport layer 5 including the plurality of protrusions 5a regularly arranged, electrons e can be more uniformly injected to the quantum dots 7 across the light-emitting element.

Embodiment 3

Figure 9:
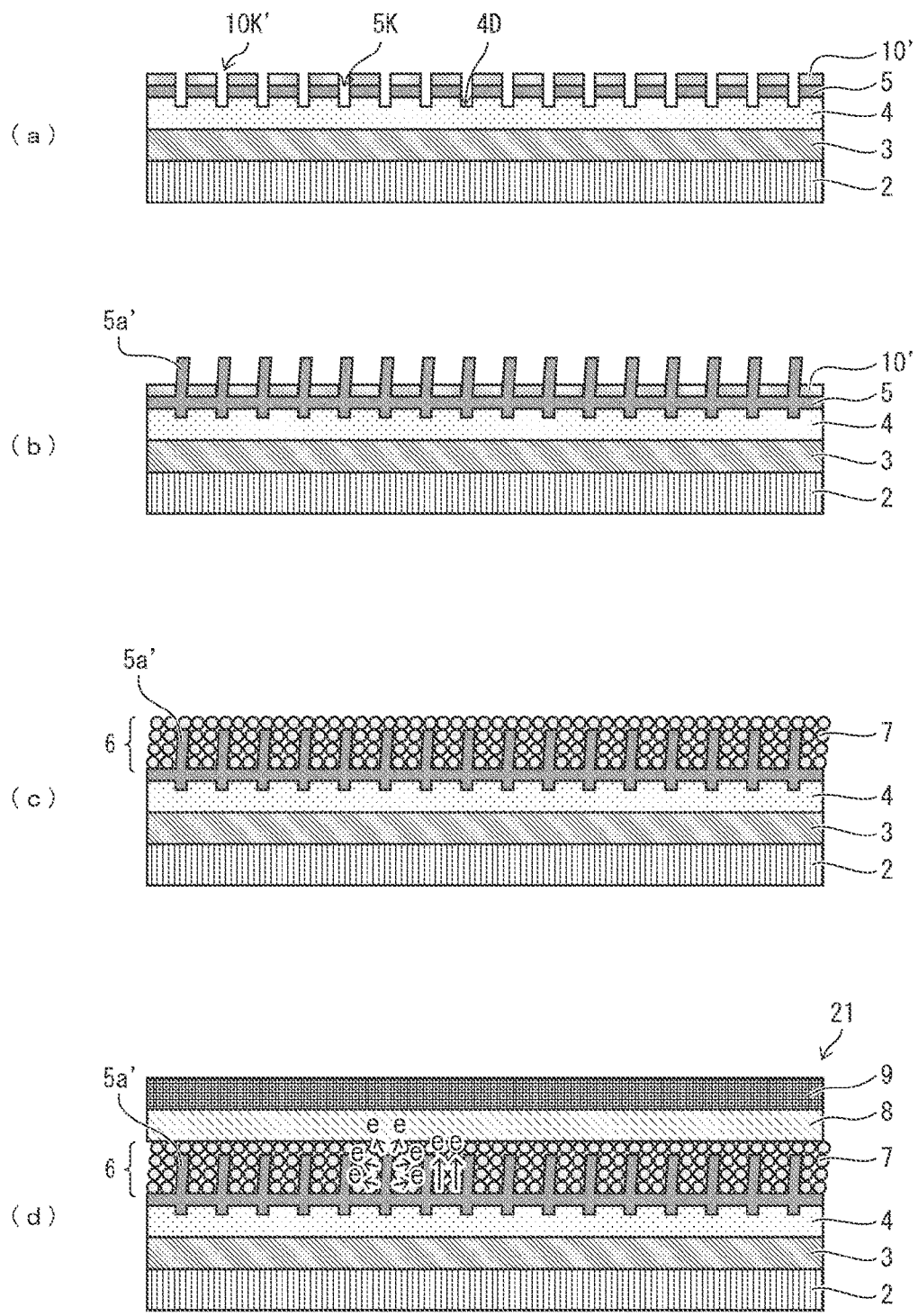
In FIG. 9, (a), (b), (c), and (d) are schematic diagrams illustrating steps of manufacturing a light-emitting element in accordance with Embodiment 3 and a structure of the light-emitting element.

A description is given next of Embodiment 3 of the disclosure with reference to FIG. 9. Embodiment 3 differs from Embodiments 1 and 2 in that there is provided a rough interface between the cathode 4 and the electron transport layer 5 in a light-emitting element 21 in accordance with the present embodiment. Embodiment 3 is otherwise the same as Embodiments 1 and 2. For convenience of description, members of the present embodiment that have the same function as members shown in the drawings for Embodiments 1 and 2 above are indicated by the same reference numerals, and description thereof is omitted.

Portions (a) to (d) of FIG. 9 are schematic diagrams illustrating steps of manufacturing the light-emitting element 21 and a structure of the light-emitting element 21.

Note that Embodiment 2 has already described up to the step of forming the resist layer 10' having the through holes 10K' on the base portion of the electron transport layer 5 (first carrier transport layer containing a first carrier transport material), and description thereof is omitted.

As shown in (a) of FIG. 9, depressions 4D are formed in the cathode 4, as well as the plurality of openings 5K are formed in the base portion of the electron transport layer 5, by, for example, dry etching of those parts of the cathode 4 and those parts of the base portion of the electron transport layer 5 which overlap the plurality of through holes 10K' in the resist layer 10' by using the plurality of through holes 10K' in the resist layer 10'.

Subsequently, as shown in (b) of FIG. 9, the electron transport layer 5 including a plurality of protrusions 5a' is formed by forming the depressions 4D in the cathode 4 and ZnO, which is an electron transport material (second carrier transport material), in the plurality of openings 5K in the base portion (first carrier transport layer) of the electron transport layer 5. In the present embodiment, the electron transport layer 5 including the plurality of protrusions 5a' is formed similarly by forming the plurality of protrusions 5a' by electrochemical deposition using the cathode 4. Note that to form the plurality of protrusions 5a' by electrochemical deposition, the duration of the electrochemical deposition needs to be set in view of the depth of the depressions 4D in the cathode 4.

Subsequently, as shown in (c) of FIG. 9, after the resist layer 10' is lifted off, the light-emitting layer 6 containing the quantum dots 7 is formed by, for example, applying the quantum dots 7 dispersed in a medium and then removing the medium in, for example, a thermal process.

Finally, as shown in (d) of FIG. 9, poly-TPD is, for example, applied to form, as the hole transport layer 8, a film thereof to a prescribed thickness on the light-emitting layer 6 containing the quantum dots 7. Thereafter, a film of Al is formed, as the anode 9, to a thickness of 100 nm on the hole transport layer 8 by, for example, vapor deposition or sputtering. Note that, for example, a sealing layer may be formed on the anode 9 where necessary.

The light-emitting element 21 shown in (d) of FIG. 9 eliminates, in the manufacturing steps, the need for dry etching only on the base portion of the electron transport layer 5 as shown in (a) of FIG. 9 and allows dry etching up to parts of the cathode 4 which is an underlying layer for the base portion of the electron transport layer 5. Therefore, the light-emitting element 21 allows for greater step margins in the dry etching step, thereby reducing defect rates. The present embodiment has so far discussed an example where the depressions 4D are formed in the cathode 4, and the plurality of openings 5K are formed in the base portion of the electron transport layer 5, both by dry etching. This is however not the only possible implementation of the disclosure. Alternatively, the depressions 4D in the cathode 4 and the plurality of openings 5K in the base portion of the electron transport layer 5 may be formed by wet etching. The light-emitting element 21 allows for greater step margins in this wet etching step, thereby reducing defect rates.

Embodiment 4

Figure 10:
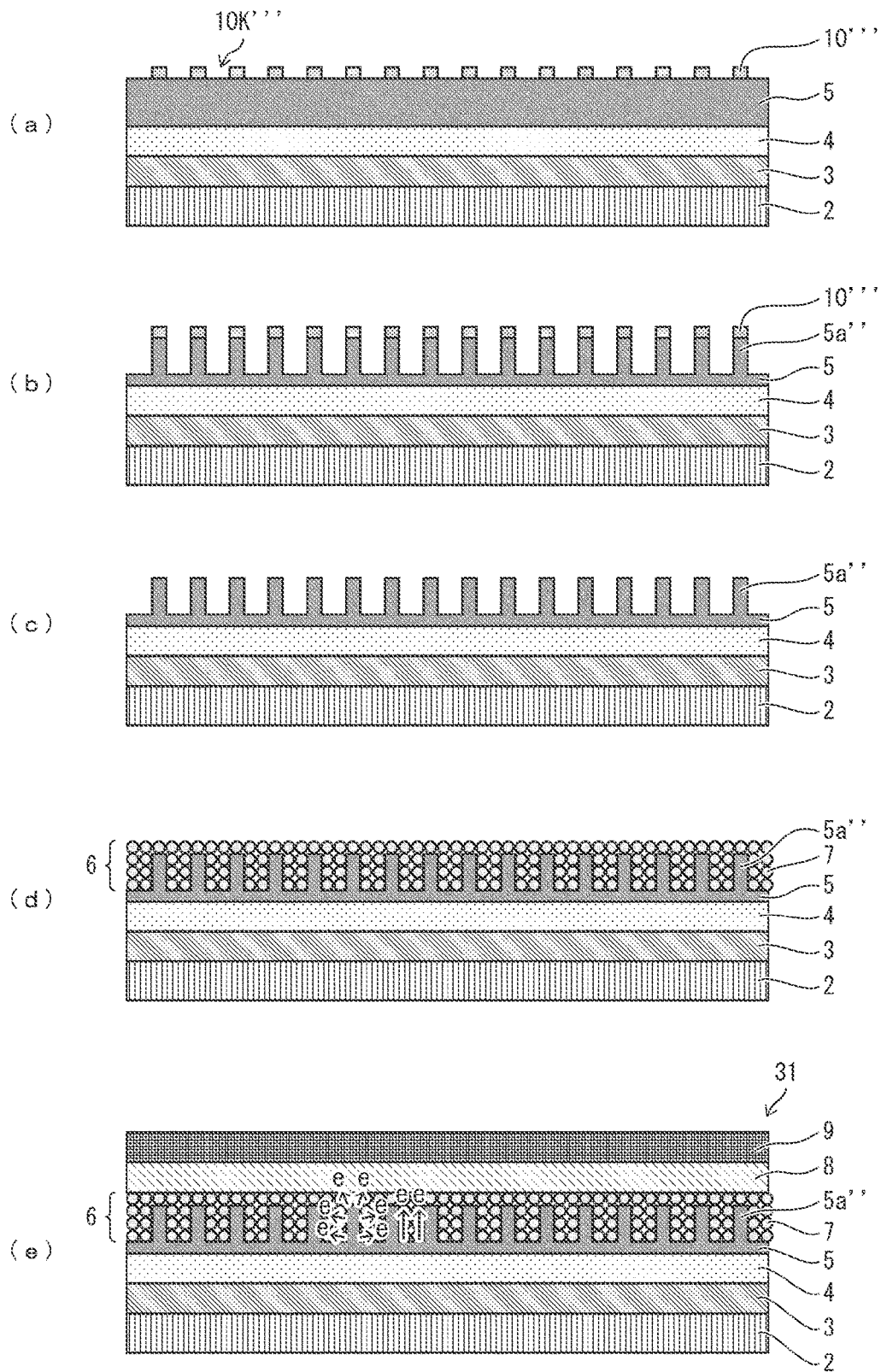
In FIG. 10, (a), (b), (c), (d), and (e) are schematic diagrams illustrating steps of manufacturing a light-emitting element in accordance with Embodiment 4 and a structure of the light-emitting element.

A description is given next of Embodiment 4 of the disclosure with reference to FIG. 10. Embodiment 4 differs from Embodiments 1 to 3 in that a plurality of protrusions 5a″ of the electron transport layer 5 are formed by anisotropic etching in a light-emitting element 31 in accordance with the present embodiment. Embodiment 4s is otherwise the same as Embodiments 1 to 3. For convenience of description, members of the present embodiment that have the same function as members shown in the drawings for Embodiments 1 to 3 above are indicated by the same reference numerals, and description thereof is omitted.

Portions (a) to (e) of FIG. 10 are schematic diagrams illustrating steps of manufacturing the light-emitting element 31 in accordance with Embodiment 4 and a structure of the light-emitting element 31.

As shown in (a) of FIG. 10, the electron transport layer 5 for forming the base portion of the electron transport layer 5 and the plurality of protrusions 5a″ of the electron transport layer 5 is formed of ZnO on the cathode 4. In the step of forming the electron transport layer 5, the thickness of the electron transport layer 5 needs to be large in accordance with the height of the plurality of protrusions 5a″ of the electron transport layer 5. Thereafter, a resist layer 101′″ having a plurality of through holes 10K′″ is formed so as to overlap only those parts where the plurality of protrusions 5a″ of the electron transport layer 5 are to be formed. Note that the resist layer 10′″ preferably has more resistance to the wet etchant used in a post-process than a prescribed level.

Thereafter, as shown in (b) of FIG. 10, the base portion of the electron transport layer 5 and the plurality of protrusions 5a′ of the electron transport layer 5 can be formed in a single step by anisotropic etching using the resist layer 10′″ as a mask and, for example, KOH (potassium hydroxide), which is a wet etchant. Specifically, as shown in (a) of FIG. 10, the plurality of protrusions 5a″ of the electron transport layer 5 are formed on those parts of the electron transport layer 5 having an increased thickness in accordance with the height of the plurality of protrusions 5a″ of the electron transport layer 5 which overlap the resist layer 10′″. Meanwhile, the electron transport layer 5 having an increased thickness is etched and hence thinned down in those parts which do not overlap the resist layer 10′″, in other words, in the plurality of through holes 10K′″ in the resist layer 10′″, to form the base portion of the electron transport layer 5.

Subsequently, as shown in (c) of FIG. 10, after the resist layer 10′″ is lifted off, the light-emitting layer 6 containing the quantum dots 7 is formed by, for example, applying the quantum dots 7 dispersed in a medium and then removing the medium in, for example, a thermal process as shown in (d) of FIG. 10.

Finally, as shown in (e) of FIG. 10, poly-TPD is, for example, applied to form, as the hole transport layer 8, a film thereof to a prescribed thickness on the light-emitting layer 6 containing the quantum dots 7. Thereafter, a film of Al is formed, as the anode 9, to a thickness of 100 nm on the hole transport layer 8 by, for example, vapor deposition or sputtering. Note that, for example, a sealing layer may be formed on the anode 9 where necessary.

In the manufacture of the light-emitting element 31 shown in (e) of FIG. 10, the base portion of the electron transport layer 5 and the plurality of protrusions 5a′ of the electron transport layer 5 can be formed in a single step as shown in (b) of FIG. 10. Furthermore, as shown in (a) of FIG. 10, when the electron transport layer 5 for forming the base portion of the electron transport layer 5 and the plurality of protrusions 5a″ of the electron transport layer 5 are formed of, for example, ZnO, the electron transport layer 5 can be formed without using, for example, electrochemical deposition. Therefore, the light-emitting element 31 can be manufactured with high productivity, and the resultant light-emitting element 31 has a high injection efficiency of electrons e to the quantum dots 7 and a low contact resistance between the light-emitting layer 6 and the electron transport layer 5.

Embodiment 5

Figure 11:
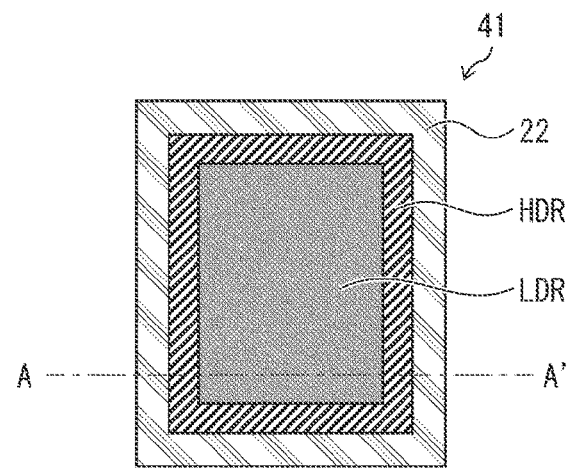
In FIG. 11, (a) is a schematic diagram showing a structure of a light-emitting element in accordance with Embodiment 5, and (b) is a cross-sectional view taken along line A-A' shown in (a).
Figure 11:
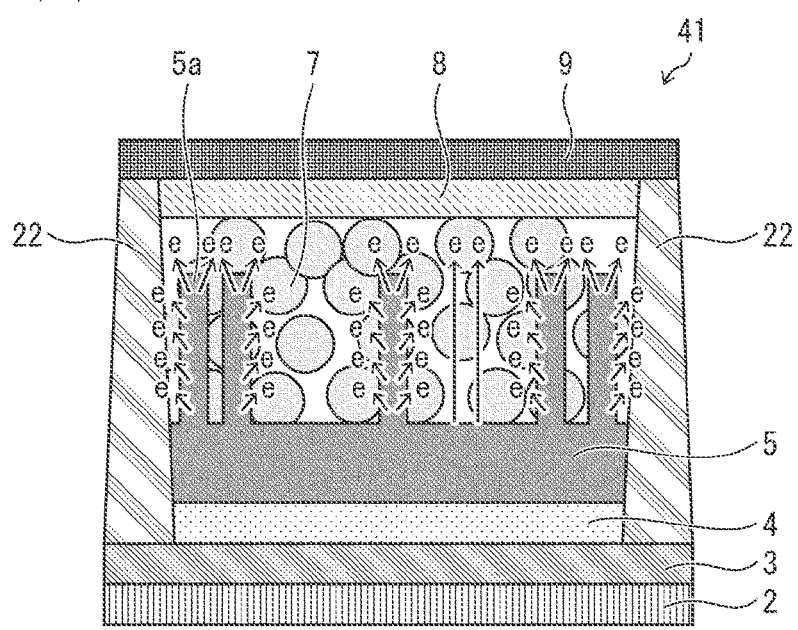

A description is given next of Embodiment 5 of the disclosure with reference to FIG. 11. Embodiment 5 differs from Embodiments 1 to 4 in that in a light-emitting element 41 in accordance with the present embodiment, the protrusions 5a of the electron transport layer 5 have a higher density in a region HDR overlapping an edge portion of the cathode 4 than in a region LDR internal to the region HDR overlapping an edge portion of the cathode 4. Embodiment 5 is otherwise the same as Embodiments 1 to 4. For convenience of description, members of the present embodiment that have the same function as members shown in the drawings for Embodiments 1 to 4 above are indicated by the same reference numerals, and description thereof is omitted.

Portion (a) of FIG. 11 is a schematic diagram showing a structure of the light-emitting element 41 in accordance with Embodiment 5, and (b) of FIG. 11 is a cross-sectional view taken along line A-A' shown in (a) of FIG. 11.

As shown in (a) of FIG. 11, the protrusions 5a of the electron transport layer 5 have a higher density in the region HDR overlapping an edge portion of the cathode 4 than in the region LDR internal to the region HDR overlapping an edge portion of the cathode 4.

As shown in (b) of FIG. 11, the region HDR overlapping an edge portion of the cathode 4 is close to a bank 22, and the injection efficiency of electrons e is low close to the bank 22. Accordingly, the protrusions 5a of the electron transport layer 5 are formed with a high density in this region. On the other hand, the injection efficiency of electrons e is high in the region LDR internal to the region HDR overlapping an edge portion of the cathode 4, in other words, the region far from the bank 22. Accordingly, the protrusions 5a of the electron transport layer 5 are formed with a low density in this region.

The light-emitting element 41 enables a uniform injection efficiency of electrons in the in-plane direction of the light-emitting element, thereby addressing non-uniform light emission in the in-plane direction of the light-emitting element.

Embodiment 6

Figure 12:
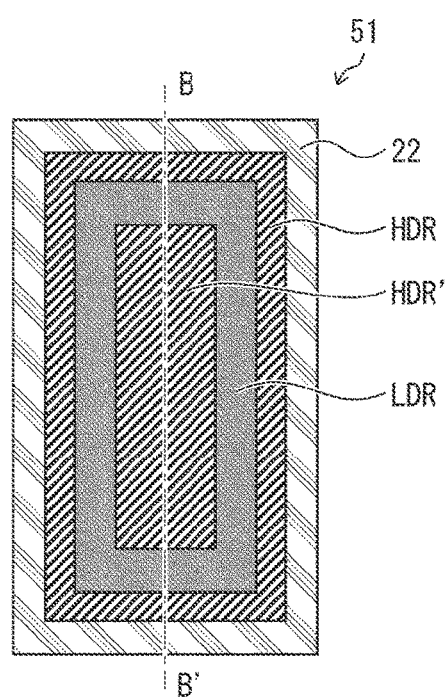
In FIG. 12, (a) is a schematic diagram showing a structure of a light-emitting element in accordance with Embodiment 6, and (b) is a cross-sectional view taken along line B-B' shown in (a).
Figure 12:
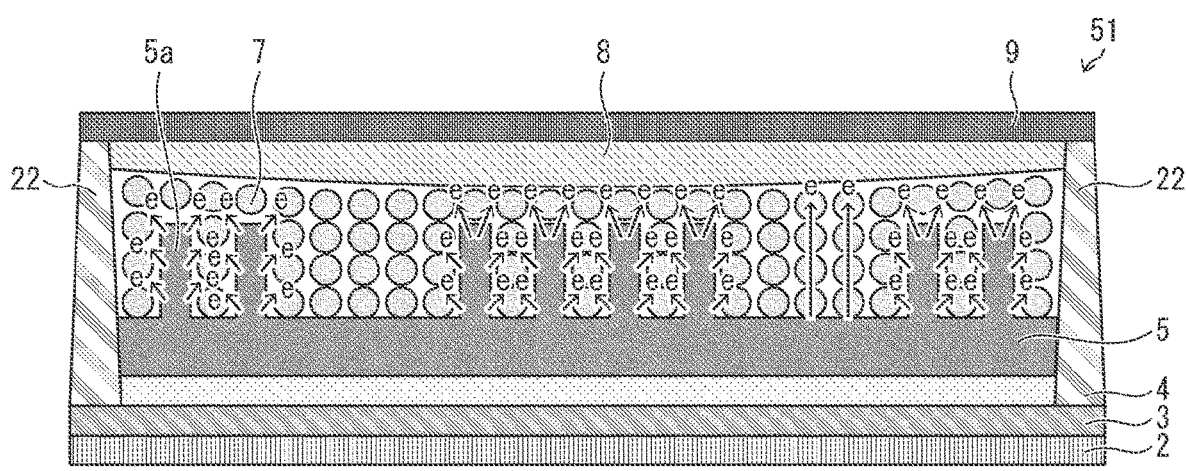

A description is given next of Embodiment 6 of the disclosure with reference to FIG. 12. Embodiment 6 differs from Embodiment 5 in that in a light-emitting element 51 in accordance with the present embodiment, the protrusions 5a of the electron transport layer 5 have a higher density in a region HDR overlapping an edge portion of the cathode 4 and in a region HDR' overlapping a central portion of the cathode 4 than in a region LDR overlapping that part of the cathode 4 which sits between the edge and central portions of the cathode 4. Embodiment 6 is otherwise the same as Embodiment 5. For convenience of description, members of the present embodiment that have the same function as members shown in the drawings for Embodiment 5 above are indicated by the same reference numerals, and description thereof is omitted.

Portion (a) of FIG. 12 is a schematic diagram showing a structure of the light-emitting element 51 in accordance with Embodiment 6, and (b) of FIG. 12 is a cross-sectional view taken along line B-B' shown in (a) of FIG. 12.

As shown in (a) of FIG. 12, the protrusions 5a of the electron transport layer 5 have a higher density in the region HDR overlapping an edge portion of the cathode 4 and in the region HDR' overlapping the central portion of the cathode 4 than in the region LDR overlapping that part of the cathode 4 which sits between the edge and central portions of the cathode 4.

As shown in (b) of FIG. 12, the region HDR overlapping an edge portion of the cathode 4 is close to a bank 22, and the injection efficiency of electrons e is low close to the bank 22. Accordingly, the protrusions 5a of the electron transport layer 5 are formed with a high density in this region. In addition, the light-emitting layer containing the quantum dots 7 could be formed thinner in the region HDR' overlapping the central portion of the cathode 4 than in other regions, due to the adverse effects of, for example, coffee rings produced in forming the light-emitting layer. In the parts where the light-emitting layer is formed thin, luminance could decrease for the thinner light-emitting layer. Accordingly, the protrusions 5a of the electron transport layer 5 are formed with a high density in this region, thereby restraining decreases in luminance.

The light-emitting element 51 can address non-uniform light emission in the in-plane direction of the light-emitting element.

Embodiment 7

Figure 13:
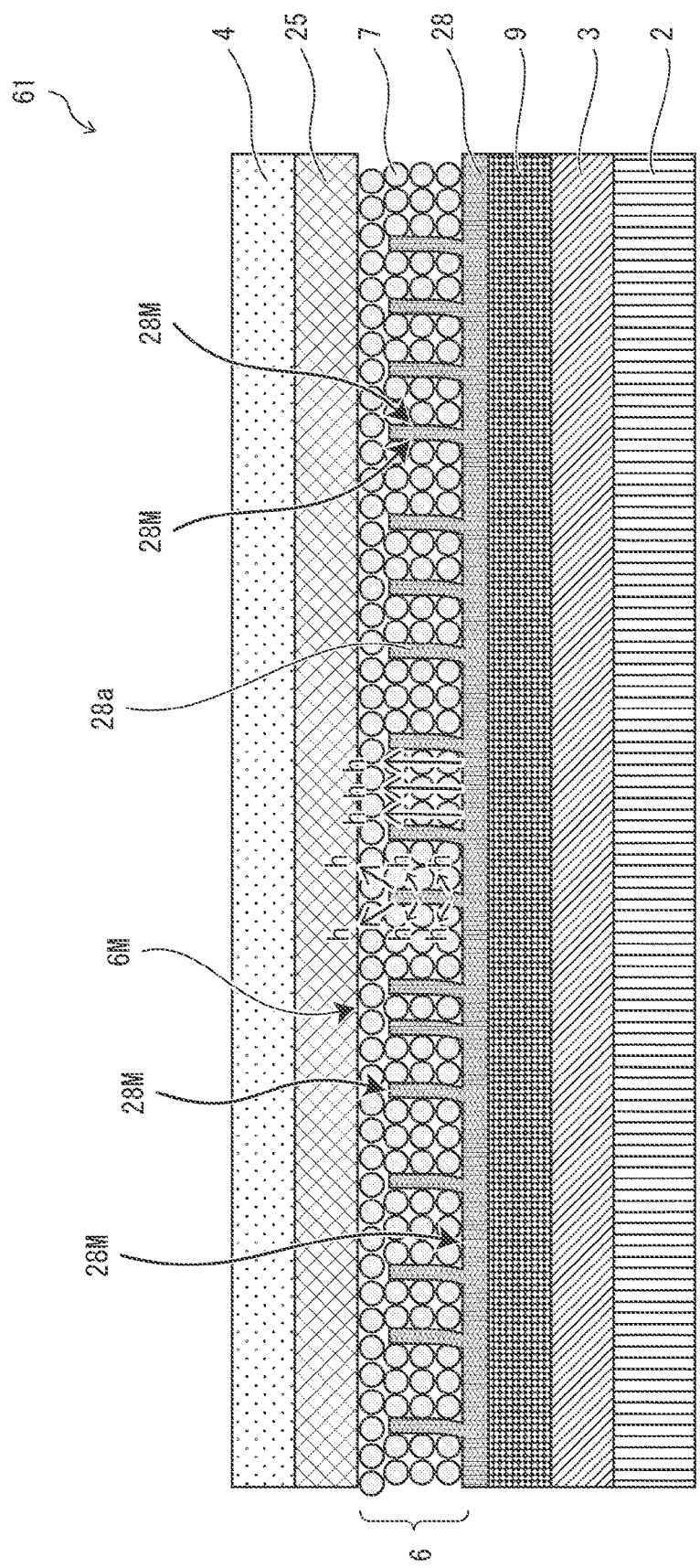
FIG. 13 is a schematic cross-sectional view of a structure of a light-emitting element in accordance with Embodiment 7.

A description is given next of Embodiment 7 of the disclosure with reference to FIG. 13. Embodiment 7 differs from Embodiments 1 to 6 in that a light-emitting element 61 in accordance with the present embodiment includes a hole transport layer 28 including a plurality of protrusions 28a. Embodiment 7 is otherwise the same as Embodiments 1 to 6. For convenience of description, members of the present embodiment that have the same function as members shown in the drawings for Embodiments 1 to 6 above are indicated by the same reference numerals, and description thereof is omitted.

FIG. 13 is a schematic cross-sectional view of a structure of the light-emitting element 61 in accordance with Embodiment 7.

Referring to FIG. 13, the light-emitting element 61, formed on a TFT layer 3, includes: an anode (first electrode) 9; a cathode 4 (second electrode) disposed opposite the anode 9; a light-emitting layer 6, of quantum dots 7, disposed between the anode 9 and the cathode 4; and a hole transport layer (carrier transport layer) 28 disposed between the anode 9 and a surface 6M of the light-emitting layer 6 on the cathode 4 side and containing the plurality of protrusions 28a extending toward the cathode 4 side. The hole transport layer 28 including the plurality of protrusions 28a has, on the light-emitting layer 6 side, a surface 28M that is covered by the quantum dots 7.

The present embodiment describes, as an example, a structure where the quantum dots 7 cover the entire protrusions 28a of the hole transport layer 28 and the entire gaps between the plurality of protrusions 28a (those parts of the base portion of the hole transport layer 28 which are exposed between the plurality of protrusions 28a), as shown in FIG. 13. This is however not the only possible implementation of the disclosure. Alternatively, the quantum dots 7 may cover parts of the plurality of protrusions 28a of the hole transport layer 28 and parts of the gaps between the plurality of protrusions 28a. In other words, the quantum dots 7 may not cover parts of the plurality of protrusions 28a of the hole transport layer 28 and parts of the gaps between the plurality of protrusions 28a.

Referring to FIG. 13, there may be further provided an electron transport layer 25 between the light-emitting layer 6 and the cathode 4. Additionally, there may be provided an electron injection layer (not shown) between the electron transport layer 25 and the cathode 4 where necessary.

The present embodiment describes, as an example, a structure where the hole transport layer 28 including the plurality of protrusions 28a is formed directly on the anode 9. This is however not the only possible implementation of the disclosure. Alternatively, for example, there may be provided a hole injection layer (not shown) between the anode 9 and the hole transport layer 28 including the plurality of protrusions 28a where necessary.

Note that the anode 9 is electrically connected to, for example, the drain electrode of a TFT element (not shown) in the TFT layer 3 via a contact hole.

The present embodiment describes, as an example, a structure where the base portion of the hole transport layer 28 (i.e., the part of the hole transport layer 28 other than the plurality of protrusions 28a) and the plurality of protrusions 28a of the hole transport layer 28 are formed of NiO, in other words, the plurality of protrusions 28a of the hole transport layer 28 and the base portion of the hole transport layer 28 (i.e., the part of the hole transport layer 28 other than the plurality of protrusions 28a) are formed of the same element. This is however not the only possible implementation of the disclosure. Alternatively, for instance, the plurality of protrusions 28a of the hole transport layer 28 and the base portion of the hole transport layer 28 (i.e., the part of the hole transport layer 28 other than the plurality of protrusions 28a) may be formed of different materials. For example, the material for the plurality of protrusions 28a of the hole transport layer 28 and the material (first carrier transport material) for the base portion of the hole transport layer 28 (i.e., the part of the hole transport layer 28 other than the plurality of protrusions 28a) may be different materials selected from NiO and metal oxides obtained by doping NiO with at least one species of metal ions selected from Li, Na, K, Mg, and Ca.

In addition, the material for the plurality of protrusions 28a of the hole transport layer 28 and the material for the base portion of the hole transport layer 28 (i.e., the part of the hole transport layer 28 other than the plurality of protrusions 28a) have a shape that is not limited in any particular manner. The shape may be a series of films or particulate.

The present embodiment describes a structure where the plurality of protrusions 28a of the hole transport layer 28 have a columnar shape (wire shape), which is an example of a rod shape. This is however not the only possible implementation of the disclosure. Alternatively, as an example, the plurality of protrusions 28a may have a polygonal prism shape, such as a triangular prism shape, a quadrangular prism shape, or an N-gonal prism shape (N is a natural number greater than or equal to 5), which is an example of a rod shape. Additionally, the shape of the plurality of protrusions 28a is not necessarily limited to a rod shape so long as the plurality of protrusions 28a have such a shape as to extend from parts of the hole transport layer 28 that are in contact with the anode 9 toward the cathode 4 side. The plurality of protrusions 28a may have, for example, such a shape as to have a width of two or more rod-shaped protrusions 28a combined. In addition, the present embodiment describes a structure where the plurality of protrusions 28a have the same shape. Alternatively, the plurality of protrusions 28a may not have the same shape.

In the present embodiment, the plurality of protrusions 28a have a columnar shape (wire shape) with a view to the plurality of protrusions 28a isotropically and more uniformly feeding holes h to the quantum dots 7 covering the plurality of protrusions 28a, to increase the injection efficiency of holes h to the quantum dots 7. This is however not the only possible implementation of the disclosure. Alternatively, for example, the plurality of protrusions 28a may have a regular N-gonal prism shape (N is a natural number greater than or equal to 3).

Note that the diameter of the plurality of column shaped (wire-shaped) protrusions 28a in a cross-section taken perpendicular to the length direction thereof is preferably greater than or equal to the particle diameter of the quantum dots 7 and less than or equal to a thickness T1 of the light-emitting layer 6 containing the quantum dots 7 (see (a) of FIG. 3). As a preferred example, the diameter of the plurality of protrusions 28a in a cross-section taken perpendicular to the length direction thereof is from 1 nm to 100 nm, both inclusive. In the present embodiment, the plurality of protrusions 28a are formed so as to have a diameter of approximately 50 nm in a cross-section taken perpendicular to the length direction of the plurality of protrusions 28a. This is however not the only possible implementation of the disclosure.

Referring to FIG. 13, the hole transport layer 28 including the plurality of protrusions 28a is provided on the anode 9, and the quantum dots 7 in the light-emitting layer 6 are provided on the hole transport layer 28 so as to cover the plurality of protrusions 28a and the gaps between the plurality of protrusions 28a. Accordingly, the quantum dots 7 do not come into direct contact with the anode 9, and holes h are injected to the quantum dots 7 via the hole transport layer 28. The light-emitting element 61 in accordance with the present embodiment can hence restrain decreases in the efficiency of hole injection caused by the quantum dots 7 coming into direct contact with the anode 9. Additionally, the light-emitting element 61 in accordance with the present embodiment achieves a low contact resistance between the light-emitting layer 6 and the hole transport layer 28 because the quantum dots 7 are also present in the gaps between the plurality of protrusions 28a in the light-emitting element 61.

Referring to FIG. 13, in the light-emitting element 61 in accordance with the present embodiment, the injection of holes h to the quantum dots 7 in the gaps between the plurality of protrusions 28a is done by direct feeding of holes h from the plurality of protrusions 28a where holes h have higher mobility than the movement of the holes h by hopping conduction, as well as by the movement of the holes h by hopping conduction between the quantum dots 7. Additionally, the injection of holes h to the quantum dots 7 on the plurality of protrusions 28a that are far from the anode 9, which is an electrode where holes are injected, that is, to the quantum dots 7 close to the electron transport layer 25, is done similarly to the above by direct feeding of holes h from the plurality of protrusions 28a where holes h have higher mobility than the movement of the holes h by hopping conduction, as well as by the movement of the holes h by hopping conduction between the quantum dots 7. The resultant light-emitting element 61 exhibits high efficiency in injection of holes h to the quantum dots 7.

Note that the step of forming the hole transport layer 28 including the plurality of protrusions 28a may similarly employ, for example, electrochemical deposition, catalyst-free thermal vapor deposition, chemical bath deposition, pulse laser deposition (PLD), and anisotropic etching, all of which have been described in Embodiments 1 to 6.

In addition, the plurality of protrusions 28a may be regularly or irregularly arranged in Embodiments 1 to 6 as described earlier. Note that the earlier description in Embodiments 1 to 6 applies similarly to the preferred density of the plurality of protrusions 28a.

In addition, similarly to Embodiment 5, a region overlapping an edge portion of the anode 9 is close to a bank, and the injection efficiency of holes h is low close to the bank. Therefore, the protrusions 28a of the hole transport layer 28 are preferably formed with a high density in this region. Therefore, in the light-emitting element 61 in accordance with the present embodiment, the protrusions 28a of the hole transport layer 28 may have a higher density in a region overlapping an edge portion of the anode 9 than in a region internal to the region overlapping an edge portion of the anode 9.

In addition, similarly to Embodiment 6, the region overlapping an edge portion of the anode 9 is close to a bank, and the injection efficiency of holes h is low close to the bank. Accordingly, the protrusions 28a of the hole transport layer 28 are preferably formed with a high density in this region. In addition, the light-emitting layer containing the quantum dots 7 could be formed thinner in the region overlapping a central portion of the anode 9 than in other regions, due to the adverse effects of, for example, coffee rings produced in forming the light-emitting layer. In the parts where the light-emitting layer is formed thin, luminance could decrease for the thinner light-emitting layer. Accordingly, the protrusions 28a of the hole transport layer 28 are preferably formed with a high density in this region, thereby restraining decreases in luminance. Therefore, in the light-emitting element 61 in accordance with the present embodiment, the protrusions 28a of the hole transport layer 28 may have a higher density in the region overlapping an edge portion of the anode 9 and the region overlapping the central portion of the anode 9 than in the region overlapping that part of the anode 9 which sits between the edge and central portions of the anode 9.

Additional Remarks

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

INDUSTRIAL APPLICABILITY

The disclosure is applicable to light-emitting elements and methods of manufacturing light-emitting elements.

The invention claimed is:
1. A light-emitting element comprising:
a first electrode;
a second electrode disposed opposite the first electrode;

a light-emitting layer disposed between the first electrode and the second electrode and containing quantum dots; and a carrier transport layer disposed between the first electrode and a surface of the light-emitting layer on a second electrode side, including a plurality of protrusions extending toward the second electrode side, and containing a first carrier transport material, wherein at least parts of the plurality of protrusions of the carrier transport layer and at least parts of a plurality of gaps between the plurality of protrusions are covered by the quantum dots, wherein the carrier transport layer includes: a first carrier transport layer including a plurality of openings and containing the first carrier transport material; and a rod-like, second carrier transport material forming the plurality of protrusions in the plurality of openings.

2. The light-emitting element according to claim 1, wherein the plurality of protrusions have a rod shape.

3. The light-emitting element according to claim 1, wherein two closest protrusions of the plurality of protrusions are separated by a distance D1 that is larger than a particle diameter R1 of the quantum dots.

4. The light-emitting element according to claim 3, wherein the distance D1 is larger than twice the particle diameter R1 of the quantum dots.

5. The light-emitting element according to claim 3, wherein the distance D1 is from 2 nm to 100 nm, both inclusive.

6. The light-emitting element according to claim 1, wherein the plurality of protrusions covered by the quantum dots have a height H1 that is less than or equal to 75% a thickness T1 of the light-emitting layer.

7. The light-emitting element according to claim 1. wherein the plurality of protrusions are arranged in N columns each of two or more protrusions, where N is an integer greater than or equal to 2, and the two or more protrusions in two adjacent columns of the N columns have pitches P that are out of alignment.

8. The light-emitting element according to claim 1, wherein the plurality of protrusions have a density of from $2 \times 10^9$ protrusions/cm$^2$ to $7 \times 10^{12}$ protrusions/cm$^2$, both inclusive.

9. The light-emitting element according to claim 1, wherein the plurality of protrusions have a larger density in a region overlapping an edge portion of the first electrode and in a region overlapping a central portion of the first electrode than in a region overlapping a part of the first electrode between the edge and central portions of the first electrode.

10. The light-emitting element according to claim 1, wherein the plurality of protrusions have a larger density in a region overlapping an edge portion of the first electrode than in a region internal to the region overlapping the edge portion of the first electrode.

11. The light-emitting element according to claim 1, wherein the second carrier transport material is in contact with the first electrode via the plurality of openings.

12. The light-emitting element according to claim 1, wherein the first carrier transport material and the second carrier transport material each contain at least one metal oxide selected from the group consisting of ZnO, SnO$_2$, In$_2$O$_3$, TiO$_2$, and MgO or contain a metal oxide obtained by doping the metal oxide with at least one species of metal ions selected from Li, Na, K, Mg, and Ca.

13. The light-emitting element according to claim 1, wherein the first carrier transport material and the second carrier transport material each contain NiO or a metal oxide obtained by doping NiO with at least one species of metal ions selected from Li, Na, K, Mg, and Ca.

14. The light-emitting element according to claim 1, wherein the second carrier transport material has a hexagonal wurtzite crystal structure.

15. The light-emitting element according to claim 1, wherein the first carrier transport material and the second carrier transport material are made of a same element.

16. The light-emitting element according to claim 1, wherein the first electrode and the carrier transport layer have a rough interface therebetween.

17. A method of manufacturing a light-emitting element, the method comprising:

a step of forming a first electrode;

a step of forming, on the first electrode, a carrier transport layer including a plurality of protrusions and containing a first carrier transport material; and a step of forming quantum dots so as to cover at least parts of the plurality of protrusions of the carrier transport layer and at least parts of a plurality of gaps between the plurality of protrusions, wherein the step of forming the carrier transport layer including the plurality of protrusions comprises: a step of forming a plurality of openings in a first carrier transport layer containing the first carrier transport material; and a step of forming a second carrier transport material in the plurality of openings in the first carrier transport layer to form the plurality of protrusions.

18. The method according to claim 17, wherein the step of forming the plurality of openings in the first carrier transport layer comprises: a step of forming, on the first carrier transport layer, a resist layer having a plurality of through holes; and a step of forming the plurality of openings in the first carrier transport layer by using the plurality of through holes in the resist layer.

19. The method according to claim 17, wherein in the step of forming the second carrier transport material in the plurality of openings in the first carrier transport layer to form the plurality of protrusions, the second carrier transport material is formed by electrochemical deposition using the first electrode to form the plurality of protrusions.

20. The method according to claim 17, wherein the step of forming the plurality of openings in the first carrier transport layer comprises: a step of forming, on the first carrier transport layer, a resist layer having a plurality of through holes; and a step of forming the plurality of openings in the first carrier transport layer and a plurality of depressions in the first electrode by using the plurality of through holes in the resist layer.

* * * * *